(12) United States Patent
Krohn

(10) Patent No.: US 6,767,577 B1
(45) Date of Patent: Jul. 27, 2004

(54) UV CURABLE COMPOSITIONS FOR PRODUCING ELECTROLUMINESCENT COATINGS

(75) Inventor: Roy C. Krohn, Fort Gratiot, MI (US)

(73) Assignee: Allied PhotoChemical, Inc., Kimball, MI (US)

( * ) Notice: Subject to any disclaimer, the term of this patent is extended or adjusted under 35 U.S.C. 154(b) by 126 days.

(21) Appl. No.: 10/089,960

(22) PCT Filed: Oct. 5, 2000

(86) PCT No.: PCT/US00/41086

§ 371 (c)(1),
(2), (4) Date: Apr. 4, 2002

(87) PCT Pub. No.: WO01/25342

PCT Pub. Date: Apr. 12, 2001

Related U.S. Application Data

(60) Provisional application No. 60/157,944, filed on Oct. 6, 1999.

(51) Int. Cl.$^7$ ............................ B05D 5/06; C09K 11/08; C08K 3/30; C08J 3/28
(52) U.S. Cl. ........................ 427/66; 427/510; 427/512; 522/8; 522/18; 522/31; 522/42; 522/81; 522/82; 522/173; 522/182
(58) Field of Search ........................ 427/66, 510, 512; 522/8, 18, 31, 42, 81, 82, 173, 182; 252/301.36, 301.4 R, 301.6 R, 301.6 S, 301.4

(56) References Cited

U.S. PATENT DOCUMENTS

| | | |
|---|---|---|
| 3,700,754 A | 10/1972 | Schmitt et al. |
| 3,953,643 A | 4/1976 | Cheung et al. |
| 3,968,056 A | 7/1976 | Bolon et al. |
| 3,988,647 A | 10/1976 | Bolon et al. |
| 4,049,844 A | 9/1977 | Bolon et al. |
| 4,088,801 A | 5/1978 | Bolon et al. |
| 4,113,894 A | 9/1978 | Koch, II |
| 4,187,340 A | 2/1980 | Oishi et al. |
| 4,188,449 A * | 2/1980 | Lu et al. ................. 428/317.9 |
| RE30,274 E | 5/1980 | Bolon et al. |
| 4,256,591 A | 3/1981 | Yamamoto et al. |
| 4,271,212 A | 6/1981 | Stengle |
| 4,292,107 A * | 9/1981 | Tanaka et al. .............. 156/249 |
| 4,338,376 A | 7/1982 | Kritzler |
| 4,391,858 A | 7/1983 | Batzill |
| RE31,411 E | 10/1983 | Bolon et al. |
| 4,420,500 A | 12/1983 | Nakatani et al. |
| 4,439,494 A | 3/1984 | Olson |
| 4,455,205 A | 6/1984 | Olson et al. |
| 4,478,876 A | 10/1984 | Chung |
| 4,479,860 A | 10/1984 | Hayase et al. |
| 4,495,042 A | 1/1985 | Hayase et al. |
| 4,496,475 A | 1/1985 | Abrams |
| 4,513,023 A * | 4/1985 | Wary ....................... 427/511 |
| 4,533,445 A | 8/1985 | Orio |
| 4,539,258 A | 9/1985 | Panush |
| 4,547,410 A | 10/1985 | Panush et al. |
| 4,551,361 A | 11/1985 | Burzynski et al. |
| 4,557,975 A | 12/1985 | Moore |
| 4,594,315 A | 6/1986 | Shibue et al. |
| 4,640,981 A | 2/1987 | Dery et al. |
| 4,665,342 A * | 5/1987 | Topp et al. ................. 313/505 |
| 4,666,821 A | 5/1987 | Hein et al. |
| 4,684,353 A * | 8/1987 | deSouza ...................... 445/51 |
| 4,738,899 A | 4/1988 | Bluestein et al. |
| 4,788,108 A | 11/1988 | Saunders, Jr. et al. |
| 4,806,257 A | 2/1989 | Clark et al. |
| 4,814,208 A | 3/1989 | Miyazaki et al. |
| 4,816,717 A | 3/1989 | Harper et al. |
| 4,822,646 A | 4/1989 | Clark et al. |
| 4,828,758 A | 5/1989 | Gillberg-LaForce et al. |
| 4,900,763 A | 2/1990 | Kraushaar |
| 4,911,796 A | 3/1990 | Reed |
| 4,959,178 A | 9/1990 | Frentzel et al. |
| 4,960,614 A | 10/1990 | Durand |
| 4,964,948 A | 10/1990 | Reed |

(List continued on next page.)

FOREIGN PATENT DOCUMENTS

| | | |
|---|---|---|
| EP | 0 081 323 A1 | 6/1983 |
| EP | 0 530 141 A1 | 3/1993 |
| EP | 0 711 801 A2 | 5/1996 |
| EP | 0 820 217 A1 | 1/1998 |
| GB | 1 550 382 | 8/1979 |
| WO | WO 97/31051 | 8/1997 |
| WO | WO 97/45458 | 12/1997 |
| WO | WO 98/47954 | 10/1998 |
| WO | WO 98/50317 | 11/1998 |
| WO | WO 00/62586 | 10/2000 |

OTHER PUBLICATIONS

Derwent Abstract Corresponding TO JP 5279436, Oct. 1993.
English Abstract Corresponding To Japanese Application XP–002164191, JP 61203108A, Sep. 1986.
English Abstract Corresponding To Japanese Application XP–002140477, JP 6016721A, Jan. 1994.
English Abstract Corresponding To Japanese Application XP–002140476, JP 5311103A, Nov. 1993.
English Abstract Corresponding To Japanese Application XP–002158399, JP 4267097A, Sep. 1992.

*Primary Examiner*—Susan Berman
(74) *Attorney, Agent, or Firm*—Brooks Kushman P.C.

(57) ABSTRACT

The present invention discloses an ultraviolet light curable electroluminescent composition and method for making such a composition that may be used to produce an electroluminescent active layer. An active layer is a layer that when incorporated in a suitable device emits light when a voltage is applied. The disclosed composition does not contain any significant amount of volatile organic solvents that do not become incorporated in the active layer after curing. It is an advantage of the present invention that the deposition of the dielectric layer in such a device is optional when the disclosed electroluminescent composition is used to deposit the active layer.

24 Claims, 1 Drawing Sheet

U.S. PATENT DOCUMENTS

| | | |
|---|---|---|
| 4,975,471 A | 12/1990 | Hayase et al. |
| 5,006,397 A | 4/1991 | Durand |
| 5,049,480 A | 9/1991 | Nebe et al. |
| 5,068,714 A | 11/1991 | Seipler |
| 5,076,963 A * | 12/1991 | Kameyama et al. ... 252/301.36 |
| 5,100,848 A | 3/1992 | Enomoto et al. |
| 5,104,929 A | 4/1992 | Bilkadi |
| 5,116,639 A | 5/1992 | Kolk et al. |
| 5,128,387 A | 7/1992 | Shustack |
| 5,128,391 A | 7/1992 | Shustack |
| 5,149,971 A | 9/1992 | McElhaney et al. |
| 5,180,523 A | 1/1993 | Durand et al. |
| 5,180,757 A | 1/1993 | Lucey |
| 5,183,831 A | 2/1993 | Bielat et al. |
| 5,221,560 A | 6/1993 | Perkins et al. |
| 5,225,170 A | 7/1993 | Kolk et al. |
| 5,282,985 A | 2/1994 | Zabinski et al. |
| 5,296,295 A | 3/1994 | Perkins et al. |
| 5,326,636 A | 7/1994 | Durand et al. |
| 5,356,545 A | 10/1994 | Wayte |
| 5,384,160 A | 1/1995 | Frazzitta |
| 5,395,876 A | 3/1995 | Frentzel et al. |
| 5,424,182 A | 6/1995 | Marginean, Sr. et al. |
| 5,453,451 A | 9/1995 | Sokol |
| 5,454,892 A | 10/1995 | Kardon et al. |
| 5,462,701 A | 10/1995 | Hagemeyer et al. |
| 5,470,643 A | 11/1995 | Dorfman |
| 5,470,897 A | 11/1995 | Meixner et al. |
| 5,514,214 A | 5/1996 | Joel et al. |
| 5,523,143 A | 6/1996 | Hagemeyer et al. |
| 5,556,527 A | 9/1996 | Igarashi et al. |
| 5,561,730 A | 10/1996 | Lochkovic et al. |
| 5,565,126 A | 10/1996 | Kimura et al. |
| 5,587,433 A | 12/1996 | Boeckeler |
| 5,596,024 A | 1/1997 | Horie et al. |
| 5,609,918 A | 3/1997 | Yamaguchi et al. |
| 5,624,486 A | 4/1997 | Schmid et al. |
| 5,633,037 A | 5/1997 | Mayer |
| 5,686,792 A | 11/1997 | Ensign, Jr. |
| 5,698,310 A | 12/1997 | Nakamura et al. |
| 5,716,551 A | 2/1998 | Unruh et al. |
| 5,718,950 A | 2/1998 | Komatsu et al. |
| 5,747,115 A | 5/1998 | Howell et al. |
| 5,750,186 A | 5/1998 | Frazzitta |
| 5,773,487 A | 6/1998 | Sokol |
| 5,784,197 A | 7/1998 | Frey et al. |
| 5,787,218 A | 7/1998 | Ohtaka et al. |
| 5,837,745 A | 11/1998 | Safta et al. |
| 5,866,628 A | 2/1999 | Likavec et al. |
| 5,871,827 A | 2/1999 | Jaffe et al. |
| 5,883,148 A | 3/1999 | Lewandowski et al. |
| 5,888,119 A | 3/1999 | Christianson et al. |
| 5,914,162 A | 6/1999 | Bilkadi |
| 5,942,284 A | 8/1999 | Hiskes et al. |
| 5,945,502 A | 8/1999 | Hsieh et al. |
| 5,950,808 A | 9/1999 | Tanabe et al. |
| 5,968,996 A | 10/1999 | Sanchez et al. |
| 5,994,424 A | 11/1999 | Safta et al. |
| 6,054,501 A | 4/2000 | Taniguchi et al. |
| 6,165,386 A | 12/2000 | Endo et al. |
| 6,165,609 A * | 12/2000 | Curatolo ............ 428/343 |
| 6,211,262 B1 | 4/2001 | Mejiritski et al. |
| 6,261,645 B1 | 7/2001 | Betz et al. |
| 6,267,645 B1 | 7/2001 | Burga et al. |
| 6,290,881 B1 | 9/2001 | Krohn |
| 6,462,356 B1 * | 10/2002 | Koyama et al. ............ 257/79 |
| 2002/0009536 A1 * | 1/2002 | Iguchi et al. ............ 427/10 |
| 2003/0022957 A1 * | 1/2003 | Krohn et al. ............ 522/81 |

* cited by examiner

US 6,767,577 B1

UV CURABLE COMPOSITIONS FOR PRODUCING ELECTROLUMINESCENT COATINGS

CROSS-REFERENCE TO RELATED APPLICATION

This application is the U.S. national phase of PCT application number PCT/US00/41086, filed Oct. 5, 2000, which further claims the benefit of U.S. provisional application serial No. 60/157,944, filed Oct. 6, 1999.

TECHNICAL FIELD

The present invention relates to the active layer in an electroluminescent device.

BACKGROUND ART

A typical electroluminescent device is a multilayer thin film structure that emits visible light when activated by an applied voltage. The active layer in such a device will contains a phosphor. This active layer has previously been deposited applying various curable compositions to a suitable substrate followed by ultraviolet (UV) light curing or heat curing. The usual compositions, however, contain organic solvents that do not incorporate into the active layer after curing. Such solvent based systems are undesirable because of the hazards and expenses associated with volatile organic solvents.

UV radiation curable compositions are applied to a substrate through spraying, screen printing, dipping or brushing for the protection or decoration of the substrate. In the usual application, a substrate such as metals, glass, or plastics is coated with the composition and then UV light is introduced to compete the curing process. The UV curable compositions offer many advantages over typical heat curable compositions.

Heat curable compositions require the use of organic solvents that contain a significant amount of volatile organic compounds (VOCs). These VOCs escape into the atmosphere while the heat curable composition dries. Such solvent based systems are undesirable because of the hazards and expenses associated with VOCs. The hazards include water and air pollution and the expenses include the cost of complying with strict government regulation on solvent emission levels. In contrast, UV curable compositions contain reactive monomers instead of solvents; thus eliminating the detrimental effects of the VOCS.

The use of heat curable compositions not only raises environmental concerns but other disadvantages exist with their use as well. Heat curable compositions suffer from slow cure times which lead to decreased productivity. These compositions require high energy for curing due to energy loss as well as the energy required to heat the substrate. Additionally, many heat curable compositions yield poor film properties that result in decreased value of the end product.

In a typical electroluminescent device, the active layer comprises one layer of a multilayer electroluminescent device. An example of such a device would contain a substrate made of polycarbonate or glass coated with a transparent conductor such as fluorine doped tin oxide. Metallic grid lines are patterned onto the substrate. The active layer is then applied by screen printing the electroluminescent composition onto the substrate with gridlines. A dielectric coating is then optionally applied over the structure. Finally, the device is coated with a metallic backing.

The active layer is such electroluminescent devices typically contains a phosphor. Such phosphor may or may not be encapsulated with various oxides or nitrides. Encapsulation protects the phosphor from the deleterious environmental effects.

DISCLOSURE OF INVENTION

It is an object of the present invention to provide an improved electroluminescent composition that is curable by ultraviolet light.

It is another object of the present invention to provide an improved electroluminescent composition that can be applied by spraying, screen printing, dipping, and brushing.

It is still another object of the present invention to provide an improved electroluminescent composition that comprises either an encapsulated or an unencapsulated phosphor.

It is yet another object of the present invention to provide an improved electroluminescent composition that comprises at least one aliphatic acrylated oligomer that can be used to coat a substrate such that no significant amount of volatile organic solvents do not become incorporated in the coating after the composition is cured.

The present invention discloses an ultraviolet light curable electroluminescent composition and method for making such a composition that may be used to produce an electroluminescent active layer. In this context, an active layer is a layer that when incorporated in a suitable device emits light when a voltage is applied. The disclosed composition does not contain any significant amount of volatile organic solvents that do not become incorporated in the active layer after curing. Specifically, the electroluminescent composition contains 5% or less volatile organic solvents by weight. It is an advantage of the present invention that the deposition of the dielectric layer in such a device is optional when the disclosed electroluminescent composition is used to deposit the active layer.

In accordance with one aspect of the invention, an ultraviolet light curable electroluminescent composition is provided. The electroluminescent composition comprises a mixture of one or more aliphatic acrylated oligomers, wherein the aliphatic acrylated oligomer mixture is present in an amount of about 10% to 40% of the electroluminescent composition. All percentages of the electroluminescent composition as expressed in this document refer to the weight percentage of the stated component to the total mass of the electroluminescent composition.

The electroluminescent composition preferably comprises an isobornyl acrylate monomer in an amount of about 4% to 30% of the electroluminescent composition, optionally an adhesion promoter in an amount of 1% to 10%, a photoinitiator in an amount of about 0.5% to 6% of the electroluminescent composition, optionally, a flow promoting agent in an amount of about 0.1% to 5% of the electroluminescent composition, and an electroluminescent phosphor in an amount of 28% to 80%. The electroluminescent phosphor may either be encapsulated or unencapsulated.

In accordance with yet another aspect of the invention, a method is provided for depositing a electroluminescent coating on a substrate. The method comprises a first step of applying to the substrate a electroluminescent-containing fluid-phase composition ("electroluminescent composition"). The electroluminescent composition comprises a mixture of aliphatic acrylated oligomers, wherein the aliphatic acrylated oligomer is present in an amount of about 10% to 40% of the electroluminescent composition.

The electroluminescent composition also includes an isobornyl acrylate monomer in an amount of about 4% to 30% of the electroluminescent composition, a photoinitiator in an amount of about 0.5% to 6% of the electroluminescent composition, a flow promoting agent in an amount of about 0.1% to 5% of the electroluminescent composition, a copper activated zinc sulfide electroluminescent phosphor in an amount of 28% to 80%, and optionally an adhesion promoter in an amount of 1% to 10%.

The method also includes a second step of illuminating the electroluminescent composition on the substrate with an ultraviolet light to cause the electroluminescent composition to cure into the electroluminescent coating.

In accordance with this method, the electroluminescent composition can be selectively deposited on the substrate at specific locations where electroluminescent plating is desired. It need not be applied to the entire substrate.

BEST MODE FOR CARRYING OUT THE INVENTION

Electroluminescent Compositions

Figure 1:
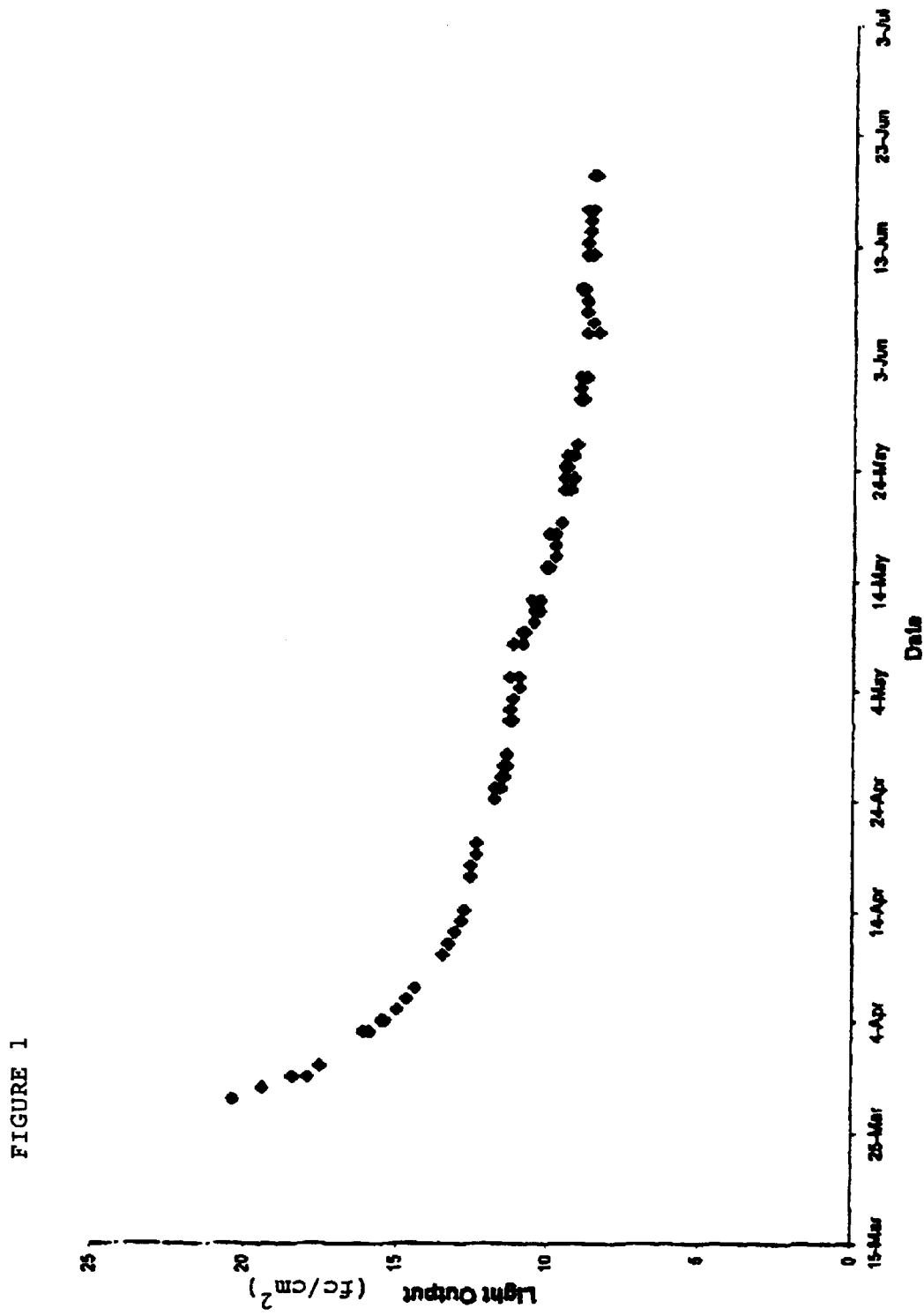
FIG. 1 is a graph that the light intensity over time of an electroluminescent device incorporating an active layer made with the composition of the present invention.

Reference will now be made in detail to presently preferred compositions or embodiments and methods of the invention, which constitute the best modes of practicing the invention presently known to the inventor.

In accordance with one aspect of the invention, a presently preferred ultraviolet light curable electroluminescent composition ("electroluminescent composition") is provided. In this preferred embodiment, the electroluminescent composition includes a mixture of aliphatic acrylated oligomers. The aliphatic acrylated oligomer mixture is preferably present in an amount of about 10% to 40% of the weight of the electroluminescent composition. In a particularly preferred embodiment the aliphatic acrylated oligomer mixture is present in an amount of about 34% of the weight of the electroluminescent composition. In another particularly preferred embodiment the aliphatic acrylated oligomer mixture is present in an amount of about 12% of the weight of the electroluminescent composition. The aliphatic acrylated oligomer preferably comprises one or more urethane oligomers. Suitable aliphatic acrylated oligomers include Radcure Ebecryl 244 (aliphatic urethane diacrylate diluted 10% with 1,6-hexanediol diacrylate), Ebecryl 264 (aliphatic urethane triacrylate diluted 15% with 1,6-hexanediol diacrylate), Ebecryl 284 (aliphatic urethane diacrylate diluted 10% with 1,6-hexanediol diacrylate) commercially available from Radcure UCB Corp. of Smyrna, Ga.; Sartomer CN-961E75 (aliphatic urethane diacrylate blended with 25% ethoxylated trimethylol propane triacylate), CN-961H81 (aliphatic urethane diacrylate blended with 19% 2(2-ethoxyethoxy)ethyl acrylate), CN-963A80 (aliphatic urethane diacrylate blended with 20% tripropylene glycol diacrylate), CN-964 (aliphatic urethane diacrylate), CN-966A80 (aliphatic urethane diacrylate blended with 20% tripropylene glycol diacrylate), CN-982A75 (aliphatic urethane diacrylate blended with 25% tripropylene glycol diacrylate) and CN-983 (aliphatic urethane diacrylate), commercially available from Sartomer Corp. of Exton, Pa.; TAB FAIRAD 8010, 8179, 8205, 8210, 8216, 8264, M-E-15, UVU-316, commercially available from TAB Chemicals of Chicago, Ill.; and Echo Resin ALU-303, commercially available from Echo Resins of Versaille, Mo.; and Genomer 4652, commercially available from Rahn Radiation Curing of Aurora, Ill. The preferred aliphatic acrylated oligomers include Ebecryl 264 and Ebecryl 284. Ebecryl 264 is an aliphatic urethane triacrylate of 1200 molecular weight supplied as an 85% solution in hexanediol diacrylate. Ebecryl 284 is aliphatic urethane diacrylate of 1200 molecular weight diluted 10% with 1,6-hexanediol diacrylate. Combinations of these materials may also be employed herein.

The preferred electroluminescent composition also includes an isobornyl acrylate monomer preferably in an amount of about 4% to 30% of the electroluninescent composition. In one particularly preferred embodiment of the present invention, the isobornyl acrylate monomer is present in an amount of about 20% of the electroluminescent composition. In another particularly preferred embodiment of the present invention, the isobornyl acrylate monomer is present in an amount of about 8% of the electroluminescent composition. Suitable isobornyl acrylate monomers include Sartomer SR423 (isobornyl methacrylate):

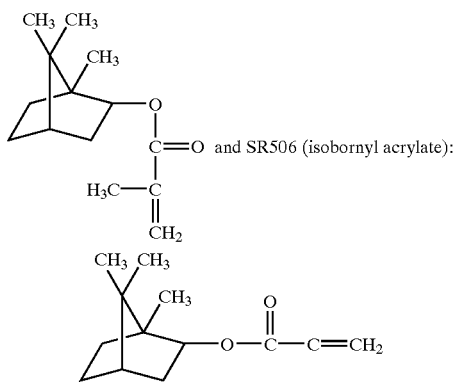

available from Sartomer Corp.; Radcure IBOA (isobornyl acrylate), commercially available from Radcure Corp.; IBOA and IBOMA, commercially available from CPS Chemical of Bradford, England; and Genomer 1121, commercially available from Rahn Radiation Curing. The preferred isobornyl acrylate monomer is Radcure IBOA, commercially available from Radcure Corp. Radcure IBOA is a high purity, low color monomer. Combinations of these materials may also be employed herein.

The preferred electroluminescent composition may also includes an adhesion promoter preferably in an amount of about 1% to 10% the electroluminescent composition. In one particularly preferred embodiment of the present invention the adhesion promoter is present in an amount of about 7%. In another particularly preferred embodiment of the present invention the adhesion promoter is present in an amount of about 3% of the electroluminescent composition. Suitable adhesion promoters include Ebecryl 168, commercially available from Radcure Corp.; and Sartomer CN 704 (acrylated polyester adhesion promoter) and CD 9052 (trifunctional acid ester), commercially available from Sartomer Corp. The preferred adhesion promoter is Ebecryl 168 which is a methacrylated acidic adhesion promoter. Combinations of these materials may also be employed herein.

The preferred electroluminescent composition also includes an electroluminescent phosphor. Preferably the electroluminescent phosphor is a copper activated zinc sulfide electroluminescent phosphor. The copper activated zinc sulfide electroluminescent phosphor is preferably present in an amount of about 28% to 80% of the electroluminescent composition. The copper activated zinc sulfide electroluminescent phosphor may either be encapsulated or unencapsulated. In one particularly preferred embodiment of the present composition the zinc sulfide electroluminescent phosphor is present in an amount of about 33%. In another particularly preferred embodiment of the present invention, the electoluminescent phosphor is a mixture of an encapsulated and unencapsulated phosphor present in a total amount of about 80% of the weight of the electroluminescent composition wherein the encapsulated phosphor is about 50% of the electroluminescent composition and the unencapsulated phosphor is about 25% of the electroluminescent composition. Suitable encapsulated electroluminescent phosphors include TNE 100, TNE 120, TNE 200 TNE 210, TNE 220, TNE 230, TNE 300, TNE 310, TNE 320, TNE 400, TNE 410 TNE 420, TNE 430, TNE 500, TNE 510, TNE 520, TNE 600, TNE 620, TNE 700, TNE 720, NE 100, NE 120, NE 200, NE 210, NE 220, NE 230, NE 300, NE 310, NE 320, NE 400, NE 410 NE 420, NE 430, NE 500, NE 510, NE 520, NE 600, NE 620, NE 700, NE 720, ANE 200, ANE 230, AND 400, and ANE 430 commercially available from Osram Sylvania. Suitable unencapsulated electrolumnmescent phosphors include 723 EL, 727 EL, 728 EL, 729 EL, 813 EL, and 814 EL commercially available from Osram Sylvania. These materials may emit red, green, yellow, blue or orange colored light based upon the particular phosphor employed. The preferred electroluminescent phosphors are TNE 100, TNE 200, TNE 410, and TNE 700, commercially available from Osram Sylvania.

This preferred electroluminescent composition also includes a photoinitiator preferably in an amount of about 0.5% to 6% of the electroluminescent composition. In one particularly preferred embodiment of the present invention the photoinitiator is present in an amount of about 3%. In another particularly preferred embodiment of the present invention the photoinitiator is present in an amount of about 1% of the electroluminescent composition. Suitable photoinitiators include Irgacure 184 (1-hydroxycyclohexyl phenyl ketone),

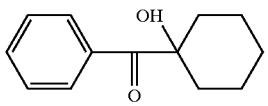

Irgacure 907
(2-methyl-1-[4-(methylthio)phenyl]-2-morpholino propan-1-one),

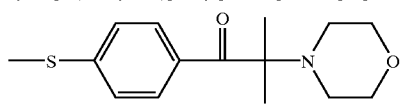

Irgacure 369
(2-benzyl-2-N, N-dimethylamino-1-(4-morpholinophenyl)-1-butanone),

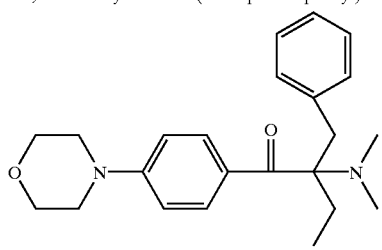

Irgacure 500
(the combination of 50% 1-hydroxy cyclohexyl phenyl ketone,

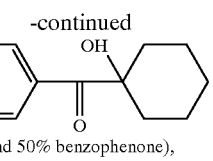

and 50% benzophenone),

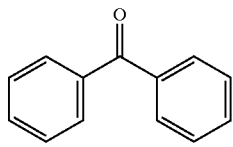

Irgacure 651 (2,2-dimethoxy-1, 2-diphenylethan-1-one),

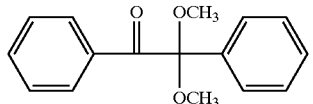

Irgacure 1700 (the combination of 25% bis(2, 6-dimethoxybenzoyl-2, 4-, 4-trimethyl pentyl) phosphine oxide,

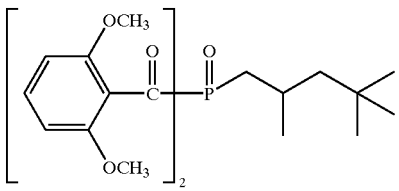

and 75% 2-hydroxy-2-methyl-1-phenyl-propan-1-one),

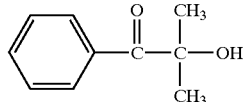

and DAROCUR 1173 (2-hydroxy-2-methyl-phenyl-1-propane),

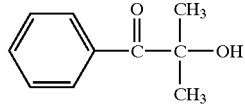

and DAROCUR 4265 (the combination of 50% 2, 4, 6-trimethylbenzoyldiphenyl-phosphine oxide,

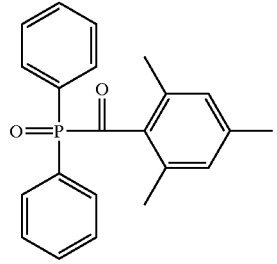

and 50% 2-hydroxy 2-methyl-1-phenyl-propan-1-one),

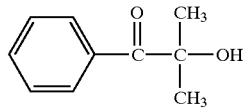

available commercially from Ciba-Geigy Corp., Tarrytown, N.Y.; CYRACURE UVI-6974 (mixed triaryl sulfonium hexafluoroantimonate salts) and cyracure UVI-6990 (mixed triaryl sulfonium hexafluorophosphate salts) available commercially from Union Carbide Chemicals and Plastics Co. Inc., Danbury, Conn.; and Genocure CQ, Genocure BOK, and Genocure M.F., commercially available from Rahn Radiation Curing. The preferred photoinitiator is Irgacure 1700 commercially available from Ciba-Geigy of Tarrytown, N.Y. Combinations of these materials may also be employed herein.

The preferred electroluminescent composition still further includes a flow promoting agent preferably in an amount of about 0.1% to 5% of the electroluminescent composition. In one particularly preferred embodiment of the present invention the flow promoting agent is present in an amount of about 3%. In another particularly preferred embodiment of the present invention the flow promoting agent is present in an amount of about 1% of the electroluminescent composition. Suitable flow promoting agents include Genorad 17, commercially available from Rahn Radiation Curing; and Modaflow, commercially available from Monsanto Chemical Co., St. Louis, Mo. The preferred flow promoting agent is Modaflow which is an ethyl acrylate and 2-ethylhexyl acrylate copolymer that improves the flow of the composition. Combinations of these materials may also be employed herein.

To illustrate, the following example sets forth a presently preferred electroluminescent composition according to this aspect of the invention.

EXAMPLE 1

This example provides a preferred electroluminescent composition according to the invention that can be used for deposition on the surface of a substrate such as a glass or polycarbonate substrate. Such a substrate may first be coated with a transparent conductor and silver grid lines. The electroluminescent composition was made from the following components:

| Component | Approximate Mass % |
| --- | --- |
| Ebecryl 264 | 16.7 |
| Ebecryl 284 | 16.7 |
| IBOA | 20.0 |
| Ebecryl 168 | 6.7 |
| Modaflow | 3.3 |
| Irgacure 1700 | 3.3 |
| TNE 200 | 33.3 |
| Total | 100.00 |

In this example the IBOA and Irgacure 1700 are mixed in a pan with a propeller blade mixer for 30 seconds at a speed of 500 to 1000 rpm. In the next step, the Ebecryl 264, the Ebecryl 284, and the Modaflow are introduced into the pan and mixed for 1 to 2 minutes at a speed of 2000 rpm. In the final step, the Ebecryl 168 adhesion promoter and TNE 200 phosphor are introduced into the pan and are mixed for 1 to 2 minutes at a speed of 2000 rpm. The temperature during mixing is monitored. The mixing is temporarily suspended if the temperature exceed 100° F. This particular electroluminescent composition may be used by the method below to produce an active layer that emits bluish-green light.

EXAMPLE 2

This example provides a preferred electroluminescent composition according to the invention that can be used for deposition on the surface of a substrate such as a glass or polycarbonate substrate. Such a substrate may first be coated with a transparent conductor and silver grid lines. The electroluminescent composition was made from the following components:

| Component | Approximate Mass % |
| --- | --- |
| Ebecryl 264 | 6.3 |
| Ebecryl 284 | 6.3 |
| IBOA | 7.5 |
| Ebecryl 168 | 2.5 |
| Modaflow | 1.3 |
| Irgacure 1700 | 1.3 |
| ANE 430 | 49.8 |
| 813 EL | 25.0 |
| Total | 100.00 |

In this example the IBOA and Irgacure 1700 are mixed in a pan with a propeller blade mixer for 30 seconds at a speed of 500 to 1000 rpm. In the next step, the Ebecryl 264, the Ebecryl 284, and the Modaflow are introduced into the pan and mixed for 1 to 2 minutes at a speed of 2000 rpm. In the final step, the Ebecryl 168 adhesion promoter, ANE 430 phosphor, and 813 EL phosphor are introduced into the pan and are mixed for 1 to 2 minutes at a speed of 2000 rpm. The temperature during mixing is monitored. The mixing is temporarily suspended if the temperature exceed 100° F. This particular electroluminescent composition may be used by the method below to produce an active layer that emits bluish-green light.

FIG. 1 is a graph of the change in light output intensity over time for an electroluminescent device incorporating an active layer made from the composition in Example 2. The electroluminescent device is made from a 4 inch by 4 inch glass substrate coated with a transparent conductor. Metallic grid lines are patterned onto the substrate. The active layer is then applied by screen printing the electroluminescent composition described in Example 2 onto the substrate. Finally, the device is coated with a silver backing. FIG. 1 shows that the light intensity of such a device when powered by a 12.5 volt transformer at 100 Hz initially is approximately 20 foot candles per square centimeter and that over a period of approximately two months the light intensity decreases and thereafter stabilizes at a value of approximately 10 foot candles per square centimeter. Furthermore, electroluminescent devices made from the composition in Example 2 have achieved light intensities as high as 88 foot candles per square centimeter for 1 inch by 1 inch devices when powered at 240 watts and 2000 Hz.

Method for Depositing an Electroluminescent Coating on a Substrate

In accordance with still another aspect of the invention, a method is provided for depositing an electroluminescent coating on a suitable substrate. This method is utilized in depositing the active layer in a multilayer electroluminescent device. The method comprises a first step of applying a phosphor-containing fluid-phase composition ("electroluminescent composition") to the substrate.

The electroluminescent composition comprises an aliphatic acrylated oligomer, the aliphatic acrylated oligomer preferably present in an amount of about 10% to 40% of the electroluminescent composition; an isobornyl acrylate monomer preferably present in an amount of about 4% to 30% of the electroluminescent composition; an photoinitiator preferably present in an amount of a preferably present bout 0.5% to 6% of the electroluminescent composition; a flow promoting agent in an amount of about 0.1% to 5% of the electroluminescent composition, and a zinc sulfide containing phosphor in an amount of 28% to 80%. The preferred electroluminescent compositions according to this method are those described herein, for example, including the compositions described in example 1 and example 2.

The electroluminescent composition may be applied to the substrate using a number of different techniques. The electroluminescent composition may be applied, for example, by direct brush application, or it may be sprayed onto the substrate surface. It also may be applied using a screen printing technique. In such screen printing technique, a "screen" as the term is used in the screen printing industry is used to regulate the flow of liquid composition onto the substrate surface. The electroluminescent composition typically would be applied to the screen as the latter contacts the substrate. The electroluminescent composition flows through the silk screen to the substrate, whereupon it adheres to the substrate at the desired film thickness. Screen printing techniques suitable for this purpose include known techniques, but wherein the process is adjusted in ways known to persons of ordinary skill in the art to accommodate the viscosity, flowability, and other properties of the liquid-phase composition, the substrate and its surface properties, etc. Flexographic techniques, for example, using pinch rollers to contact the electroluminescent composition with a rolling substrate, also may be used.

The method includes a second step of illuminating the electroluminescent-containing fluid-phase composition on the substrate with an ultraviolet light to cause the electroluminescent-containing fluid-phase composition to cure into the electroluminescent coating. This illumination may be carried out in any number of ways, provided the ultraviolet light or radiation impinges upon the electroluminescent composition so that the electroluminescent composition is caused to polymerize to form the coating, layer, film, etc., and thereby cures.

Curing preferably takes place by free radical polymerization, which is initiated by an ultraviolet radiation source. The photoinitiator preferably comprises a photoinitiator, as described above.

Various ultraviolet light sources may be used, depending on the application. Preferred ultraviolet radiation sources for a number of applications include known ultraviolet lighting equipment with energy intensity settings of, for example, 125 watts, 200 watts, and 300 watts per square inch.

Additional advantages and modifications will readily occur to those skilled in the art. Therefore, the invention in its broader aspects is not limited to the specific details, representative devices, and illustrative examples shown and described. Accordingly, departures may be made from such details without departing from the spirit or scope of the general inventive concept.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An ultraviolet (UV) curable electroluminescent composition comprising:
   at least one aliphatic acrylated oligomer;
   an isobornyl acrylate monomer;
   a photoinitiator; and
   an electroluminescent phosphor, wherein upon exposure to UV light the electroluminescent composition cures into a layer suitable for use as the active layer in an electroluminescent device and wherein the electroluminescent composition does not contain any significant amount of volatile organic solvents that do not become incorporated in the coating after the electroluminescent composition is cured.

2. The UV curable electroluminescent composition of claim 1, wherein,
   the aliphatic acrylated oligomer mixture is present in an amount of about 10% to 40% of the weight of the electroluminescent composition;
   the isobornyl acrylate monomer is present in an amount of about 4% to 30% of the weight of the electroluminescent composition;
   the photoinitiator is present in an amount of about 0.5% to 6% of the weight of the electroluminescent composition; and
   the phosphor is present in an amount of about 28% to 80% of the weight of the electroluminescent composition.

3. The UV curable electroluminescent composition of claim 2, wherein the at least one aliphatic acrylated oligomer is at least one urethane oligomer.

4. The UV curable composition of claim 2 further comprising:
   an adhesion promoter in an amount of about 1% to 10% of the weight of the composition; and
   a flow promoting agent in an amount of 0.1% to 5% of the weight of the electroluminescent composition.

5. The UV curable composition of claim 4 wherein:
   the aliphatic acrylated oligomer mixture is present in an amount of about 34% of the weight of the electroluminescent composition;
   the isobornyl acrylate monomer is present in an amount of about 20% of the weight of the electroluminescent composition;
   the photoinitiator is present in an amount of about 3% of the weight of the electroluminescent composition;
   the phosphor is present in an amount of about 33% of the weight of the electroluminescent composition;
   the adhesion promoter in an amount of about 7% of the weight of the composition; and
   the flow promoting agent in an amount of 3% of the weight of the electroluminescent composition.

6. The UV curable composition of claim 4 wherein:
   the aliphatic acrylated oligomer mixture is present in an amount of about 12% of the weight of the electroluminescent composition;
   the isobornyl acrylate monomer is present in an amount of about 8% of the weight of the electroluminescent composition;
   the photoinitiator is present in an amount of about 1% of the weight of the electroluminescent composition;
   the phosphor is present in an amount of about 75% of the weight of the electroluminescent composition;
   the adhesion promoter in an amount of about 3% of the weight of the composition; and
   the flow promoting agent in an amount of 1% of the weight of the electroluminescent composition.

7. The electroluminescent composition of claim 1 wherein the aliphatic acrylated oligomer in the mixture is selected from the group consisting of:
   a) aliphatic urethane diacrylate diluted 10% by weight with 1,6-hexanediol diacrylate;
   b) aliphatic urethane triacrylate diluted 15% by weight with 1,6-hexanediol diacrylate;

c) aliphatic urethane diacrylate blended with 20% by weight tripropylene glycol diacrylate;

d) aliphatic urethane diacrylate blended with 25% by weight ethoxylated trimethylol propane triacrylate;

e) aliphatic urethane diacrylate blended with 19% by weight 2(2-ethoxyethoxy)ethyl acrylate;

f) aliphatic urethane diacrylate blended with 20% by weight tripropylene glycol diacrylate;

g) aliphatic urethane diacrylate blended with 20% by weight tripropylene glycol diacrylate;

h) aliphatic urethane diacrylate blended with 25% by weight tripropylene glycol diacrylate;

i) aliphatic urethane diacrylate; and j) mixtures thereof.

8. The electroluminescent composition of claim 1 wherein the isobornyl acrylate monomer in the mixture is selected form the group consisting of isobornyl acrylate, isobornyl methacrylate, and mixtures thereof.

9. The electroluminescent composition of claim 1 wherein the photoinitiator is selected from the group consisting of:

1-hydroxycyclohexyl phenyl ketone;

2-methyl-1-[4-(methylthio)phenyl]-2-morpholino propan-1-one;

the combination of 50% 1-hydroxy cyclohexyl phenyl ketone and 50% benzophenone;

2,2-dimethoxy-1,2-diphenylethan-1-one;

the combination of 25% bis(2,6-dimethoxybenzoyl-2,4-, 4-trimethyl pentyl phosphine oxide and 75% 2-hydroxy-2-methyl-1-phenyl-propan-1-one;

2-hydroxy-2-methyl-1-phenyl-1-propane;

the combination of 50% 2,4,6-trimethylbenzoyldiphenyl-phosphine oxide and 50% 2-hydroxy 2-methyl-1-phenyl-propan-1-one;

mixed triaryl sulfonium hexafluoroantimonate salts;

mixed triaryl sulfonium hexafluorophosphate salts; and mixtures thereof.

10. A method for coating a substrate with an electroluminescent composition, the method comprising:

applying the electroluminescent composition to the substrate, wherein the electroluminescent composition includes:

an aliphatic acrylated oligomer mixture in an amount of about 10% to 40% of the weight of the composition;

an isobornyl acrylate monomer in an amount of about 4% to 30% of the weight of the composition;

an photoinitiator in an amount of about 0.5% to 6% of the weight of the composition;

an adhesion promoter in an amount of about 1% to 10% of the weight of the composition;

a flow promoting agent in an amount of 0.1% to 5% of the weight of the electroluminescent composition; and an electroluminescent phosphor in an amount of about 28% to 80% of the weight of the composition; and illuminating the electroluminescent composition on the substrate with an UV light sufficient to cause the electroluminescent composition to cure into a layer suitable for use as the active layer of an electroluminescent device.

11. The method of claim 10, wherein the method of applying the electroluminescent composition is spraying.

12. The method of claim 10, wherein the method of applying the electroluminescent composition is screen-printing.

13. The method of claim 10, wherein the method of applying the electroluminescent composition is dipping the substrate into the composition sufficiently to cause the composition to uniformly coat the substrate.

14. The method of claim 10, wherein the method of applying the electroluminescent composition is brushing.

15. The method of claim 10, wherein the method of applying the electroluminescent composition is selectively depositing to the substrate at predetermined locations.

16. A method of coating a substrate with an ultraviolet (UV) curable electroluminescent composition to form a electroluminescent coating comprising:

applying the electroluminescent composition to the substrate, wherein the composition includes:

an aliphatic acrylated oligomer mixture in an amount of about 10% to 40% of the weight of the electroluminescent composition;

an isobornyl acrylate monomer in an amount of about 4% to 30% of the weight of the electroluminescent composition;

a photoinitiator in an amount of about 0.5% to 6% of the weight of the electroluminescent composition;

a flow promoting agent in an amount of 0.1% to 5% of the weight of the electroluminescent composition; and an electroluminescent phosphor in an amount of about 28% to 80% of the weight of the electroluminescent composition; and illuminating the electroluminescent composition on the substrate with an UV light sufficient to cause the electroluminescent composition to cure into a layer suitable for use as the active layer of an electroluminescent device.

17. The method of claim 16, wherein, the aliphatic acrylated oligomer mixture is about 34% of the weight of the electroluminescent composition;

the isobornyl acrylate monomer is about 20% of the weight of the electroluminescent composition;

the photoinitiator is about 3% of the weight of the electroluminescent composition;

the flow promoting agent is about 3% of the weight of the electroluminescent composition; and the phosphor is about 33% of the weight of the electroluminescent composition.

18. The method of claim 17, wherein, the aliphatic acrylated oligomer mixture is about 12% of the weight of the electroluminescent composition;

the isobornyl acrylate monomer is about 8% of the weight of the electroluminescent composition;

the photoinitiator is about 1% of the weight of the electroluminescent composition;

the flow promoting agent is about 1% of the weight of the electroluminescent composition; and the phosphor is about 75% of the weight of the electroluminescent composition.

19. A method of preparing an ultraviolet (UV) curable electroluminescent composition comprising:

combining an isobornyl acrylate monomer and a photoinitiator in a pan to form a first combination;

mixing the first combination;

combining an aliphatic acrylated oligomer mixture and flow promoting agent with the first mixture to form a second combination;

mixing the second combination;

combining an electroluminescent phosphor and an adhesion promoter with the second mixture to form a third combination; and mixing the third combination.

20. A UV curable electroluminescent composition of claim 1, wherein the electroluminescent phosphor comprises a an encapsulated or unencapsulated phosphor.

21. A UV curable electroluminescent composition of claim 20, wherein the electroluminescent phosphor comprises a zinc sulfide containing phosphor.

22. A UV curable electroluminescent composition of claim 21, wherein the electroluminescent phosphor comprises a copper activated zinc sulfide electroluminescent phosphor.

23. A UV curable electroluminescent composition of claim 1, wherein the electroluminescent phosphor is present in an amount between about 28% to 80% of the weight of the electroluminescent composition.

24. An ultraviolet (UV) curable electroluminescent composition comprising:
- at least one aliphatic acrylated oligomer;
- an isobornyl acrylate monomer;
- a photoinitiator; and
- an electroluminescent phosphor, wherein upon exposure to UV light the electroluminescent composition cures into a layer suitable for use as the active layer in an electroluminescent device and wherein the electroluminescent composition does not contain any significant amount of volatile organic solvents that do not become incorporated in the coating after the electroluminescent composition is cured; and
- the electroluminescent phosphor is present in an amount of about 28% to 80% of the weight of the electroluminescent composition.

* * * * *